(12) United States Patent
Kurosawa et al.

(10) Patent No.: US 7,172,673 B2
(45) Date of Patent: Feb. 6, 2007

(54) PEELING DEVICE AND PEELING METHOD

(75) Inventors: Tetsuya Kurosawa, Yokohama (JP); Masahisa Otsuka, Tokyo (JP)

(73) Assignees: Kabushiki Kaisha Toshiba, Tokyo (JP); Lintec Corporation

( * ) Notice: Subject to any disclaimer, the term of this patent is extended or adjusted under 35 U.S.C. 154(b) by 0 days.

(21) Appl. No.: 11/038,479

(22) Filed: Jan. 21, 2005

(65) Prior Publication Data
US 2005/0205204 A1 Sep. 22, 2005

(30) Foreign Application Priority Data
Jan. 23, 2004 (JP) ............... 2004-015912

(51) Int. Cl.
*B32B 38/10* (2006.01)
(52) U.S. Cl. ............... 156/344; 156/584; 438/464; 438/976
(58) Field of Classification Search ........... 156/344, 156/584; 438/464, 976; 269/21
See application file for complete search history.

(56) References Cited

U.S. PATENT DOCUMENTS

| | | | | |
|---|---|---|---|---|
| 3,765,289 A * | 10/1973 | Gerber et al. ............... 83/452 |
| 4,732,642 A * | 3/1988 | Ametani ............... 156/497 |
| 5,000,814 A * | 3/1991 | Sumi ............... 156/344 |
| 5,106,450 A * | 4/1992 | Freisitzer et al. ............ 156/517 |
| 5,358,591 A * | 10/1994 | Candore ............... 156/344 |
| 5,540,809 A * | 7/1996 | Ida et al. ............... 156/584 |
| 5,938,890 A * | 8/1999 | Schlinkmann et al. ...... 156/541 |
| 5,971,257 A * | 10/1999 | Yang ............... 228/212 |
| 6,500,298 B1 * | 12/2002 | Wright et al. ............... 156/344 |
| 6,715,524 B2 * | 4/2004 | Chen et al. ............... 156/540 |
| 2004/0238118 A1 * | 12/2004 | Miyamoto ............... 156/344 |

FOREIGN PATENT DOCUMENTS

JP  2000-315679  11/2000

* cited by examiner

*Primary Examiner*—Mark A. Osele
(74) *Attorney, Agent, or Firm*—Lowe Hauptman & Berner, LLP.

(57) ABSTRACT

A peeling device 11 includes an adsorber 15 having an adsorbing face 20A that adsorbs and retains a wafer W, and a peeling element 17 that holds a protective sheet H stuck to the wafer W, and peels off the protective sheet H from the wafer W through moving relatively to the adsorber 15. The adsorber 15 and the peeling element 17 are arranged so as to peel off the protective sheet H from the wafer W intermittently through moving relatively to each other while a peeling operation and a counter-peeling operation are performed alternately.

12 Claims, 12 Drawing Sheets

[FIG. 1]
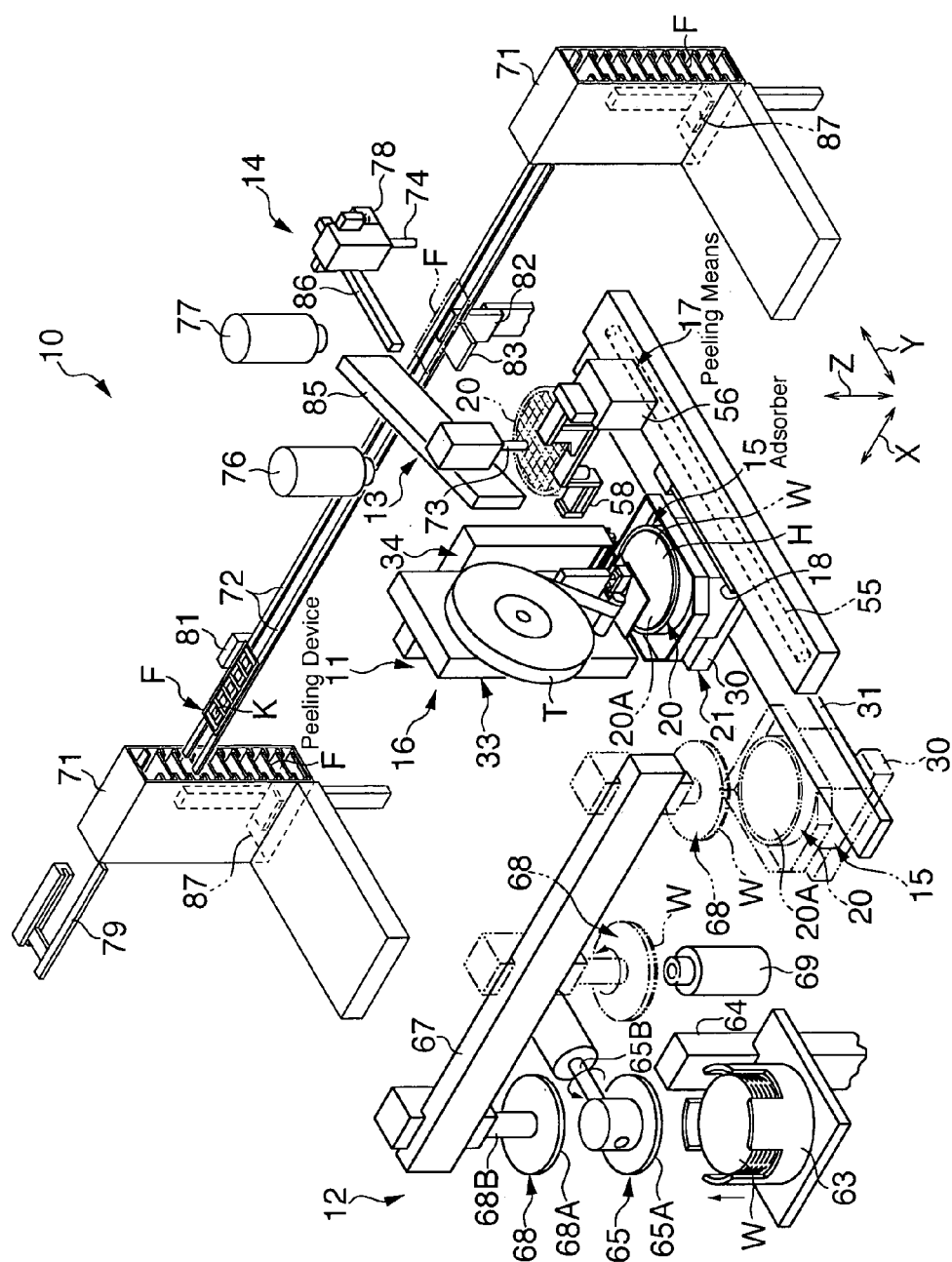

[FIG. 2]
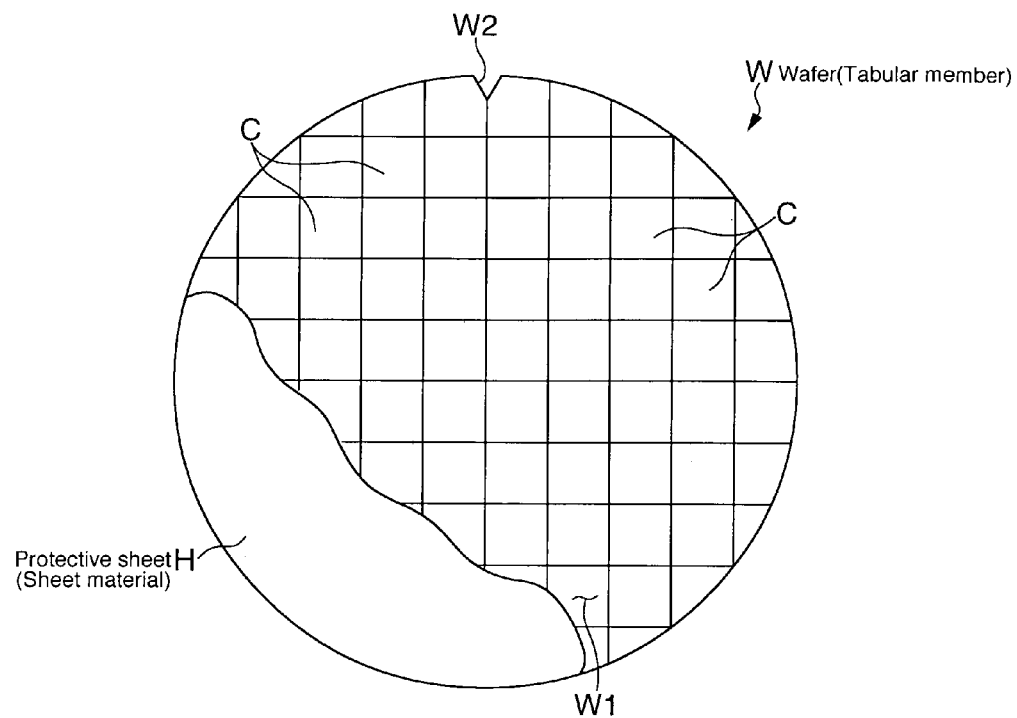
[FIG. 3]
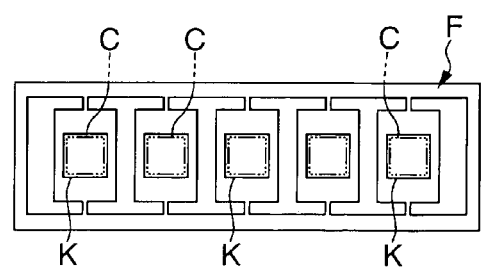

[FIG. 4]
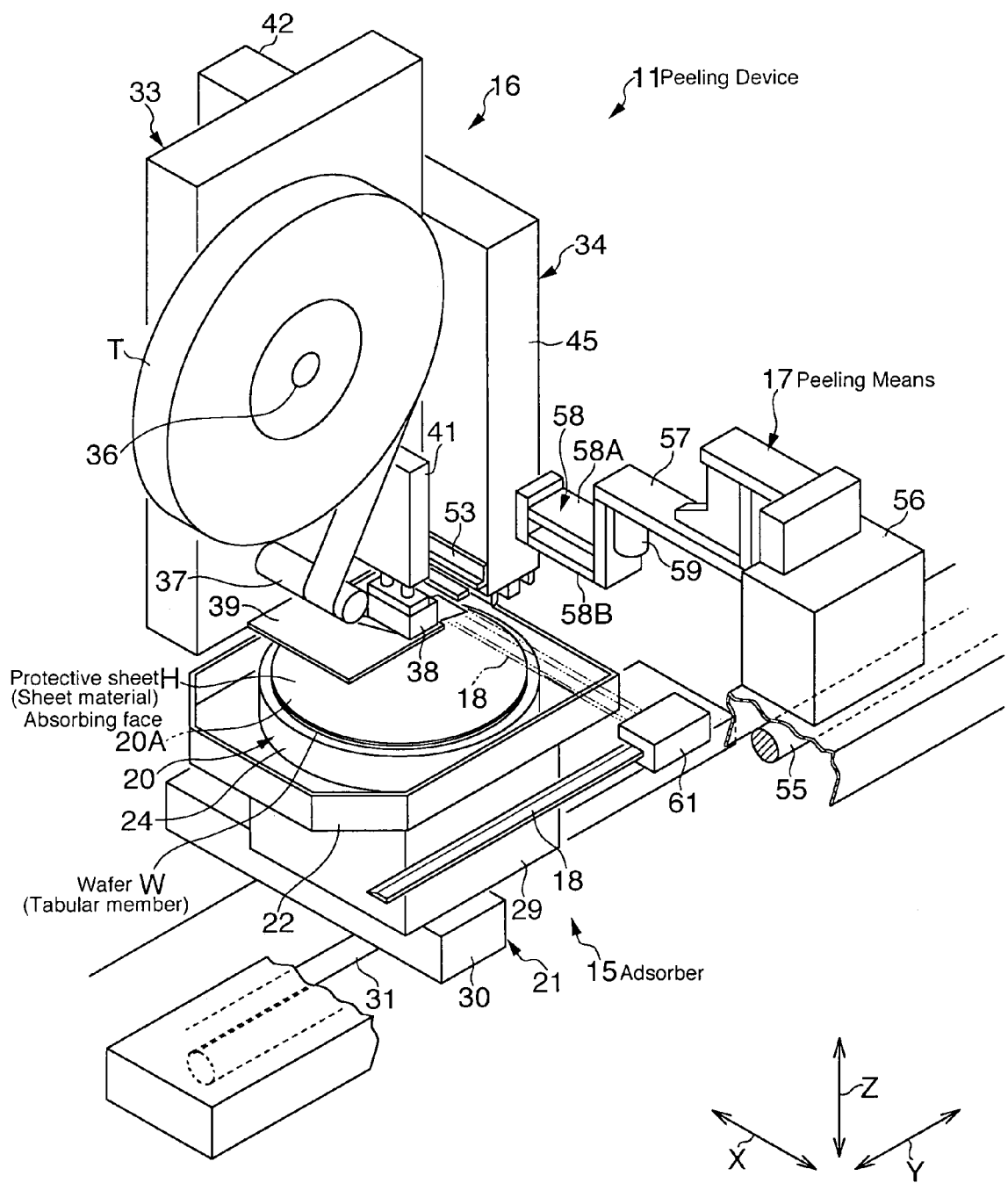

[FIG. 5]
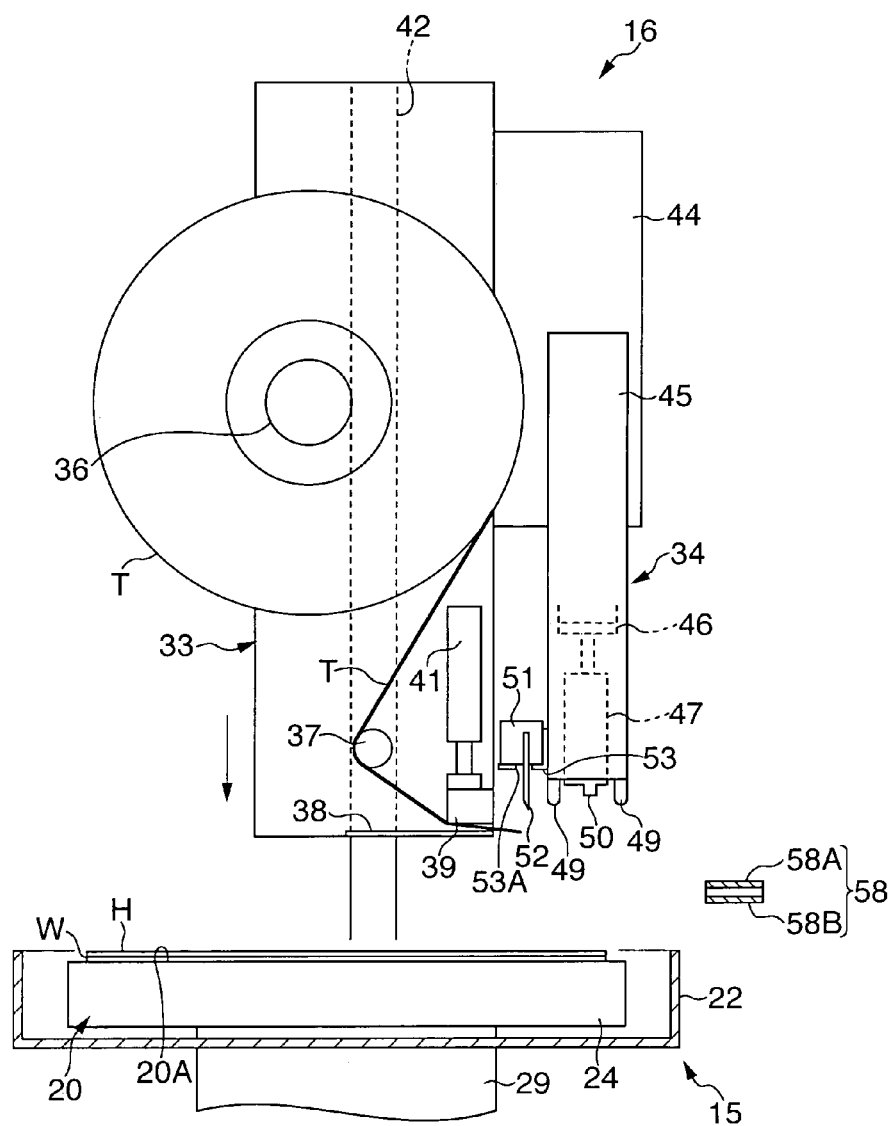

[FIG. 6]
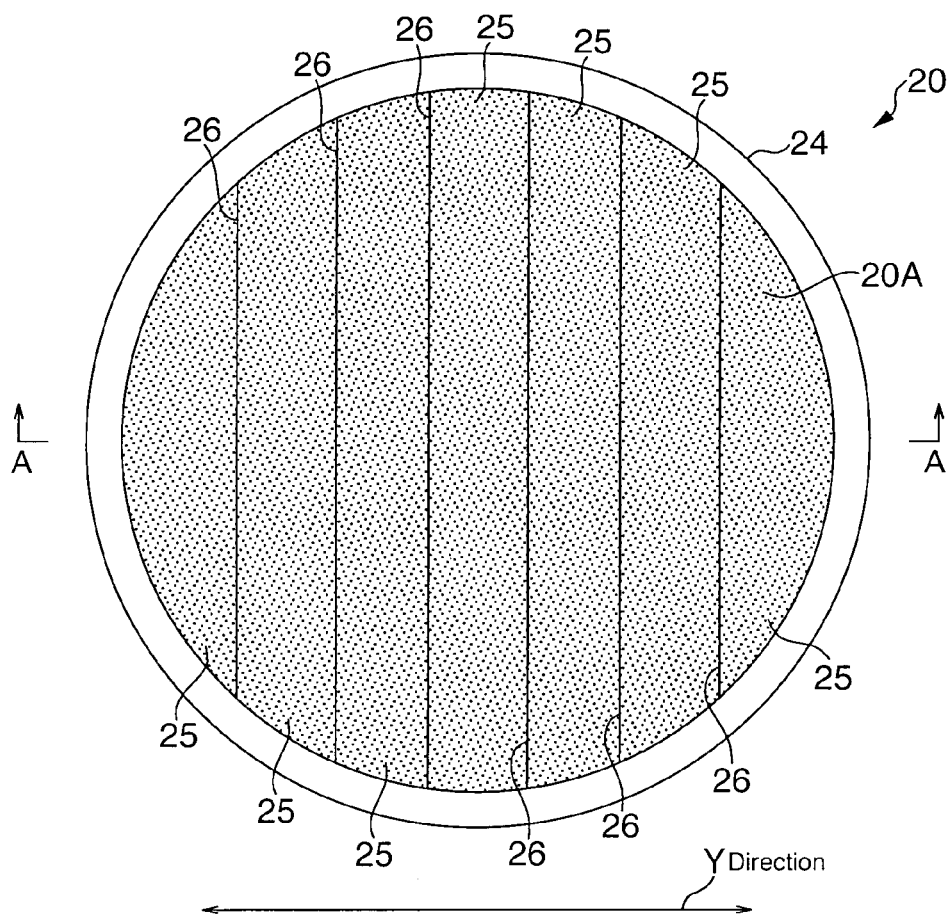
[FIG. 7]
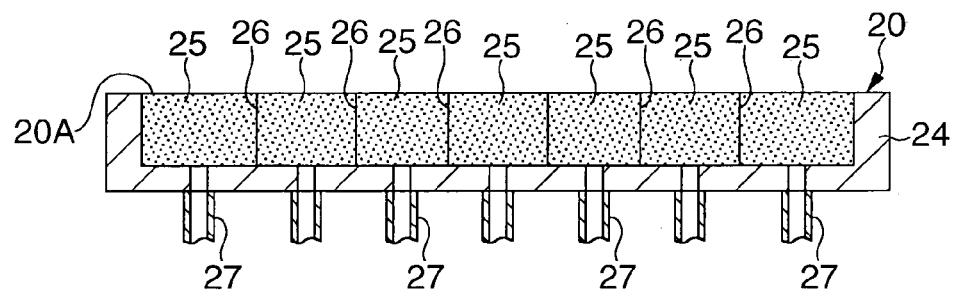

[FIG. 8]
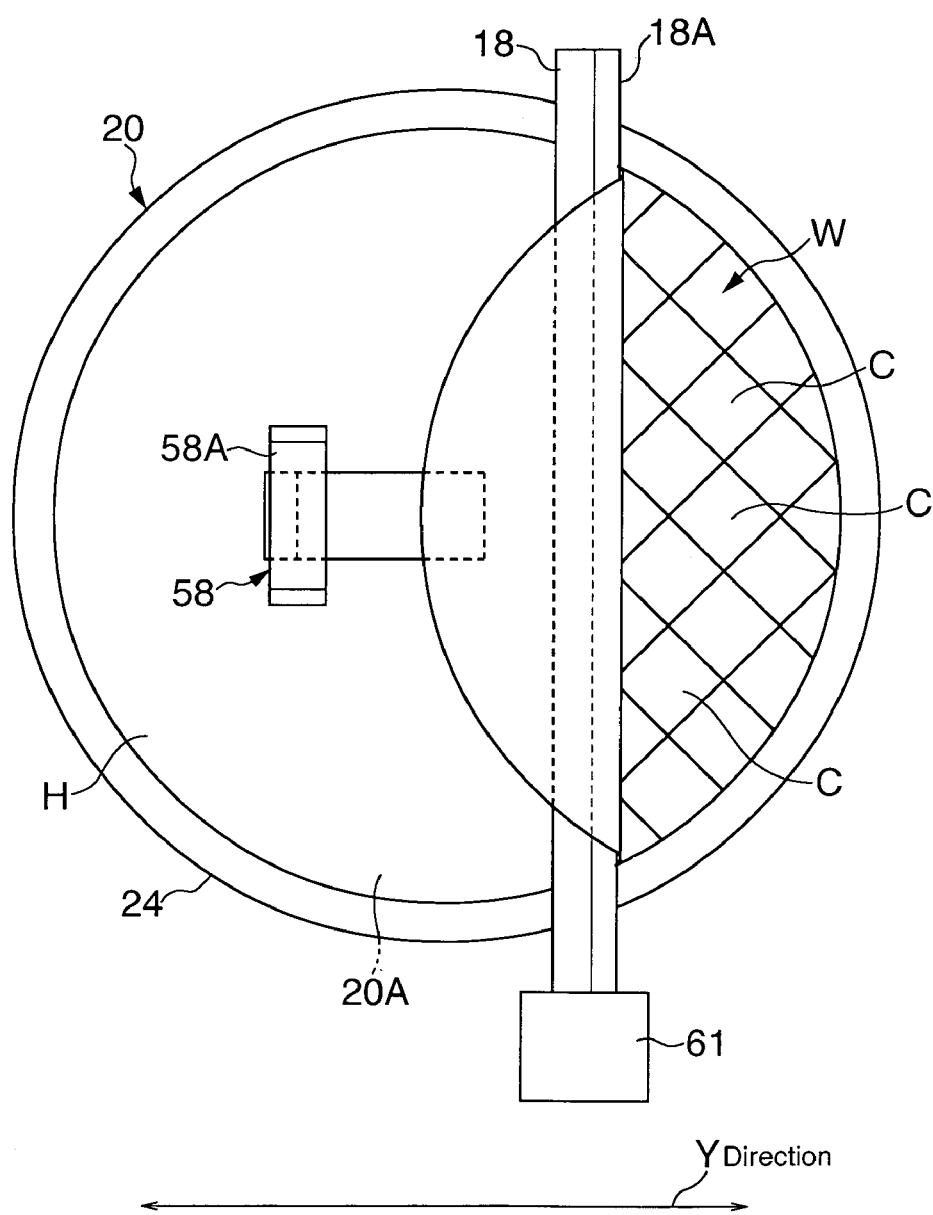

[FIG. 9]
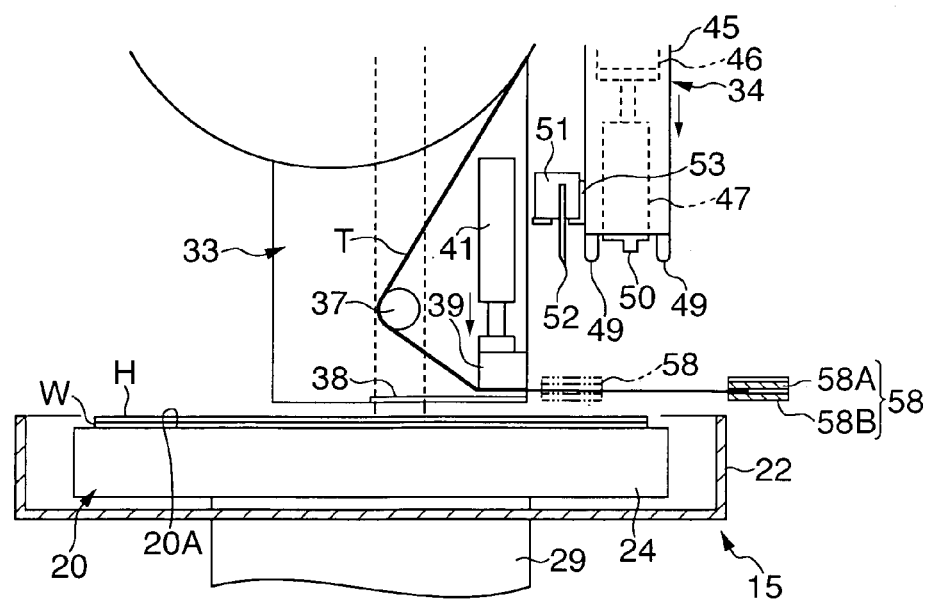
[FIG. 10]
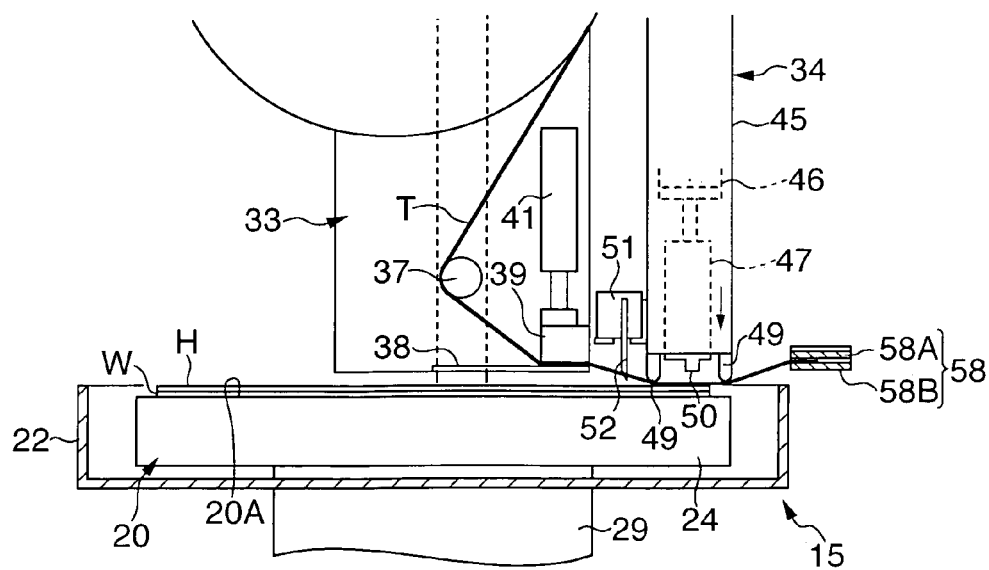

[FIG. 11]
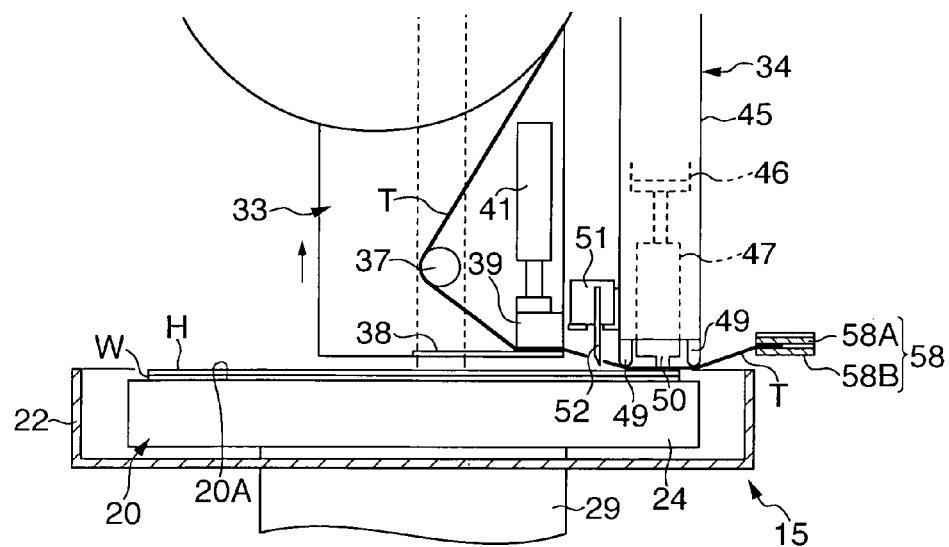
[FIG. 12]
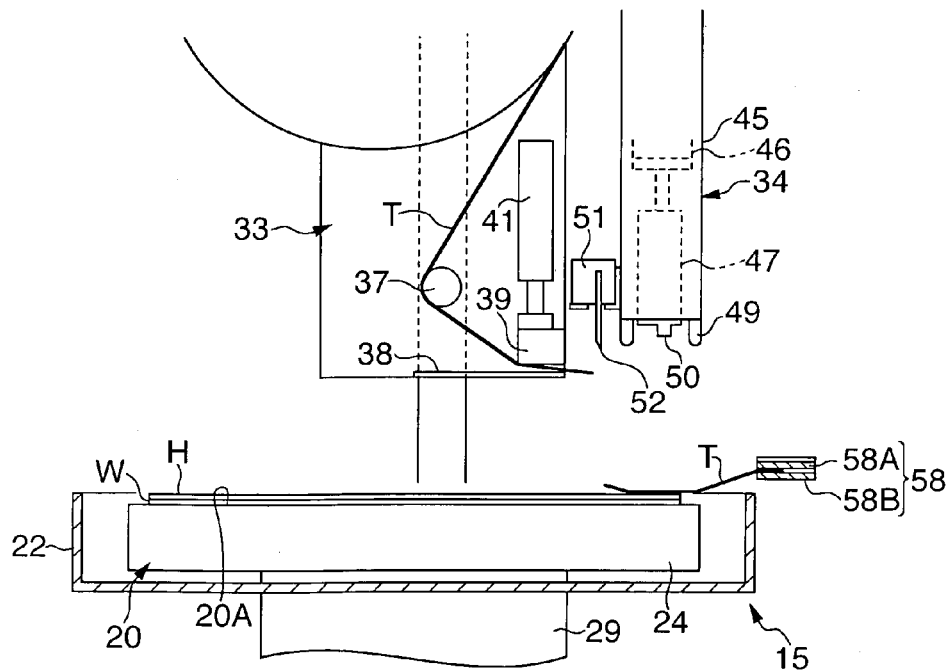

[FIG. 13]
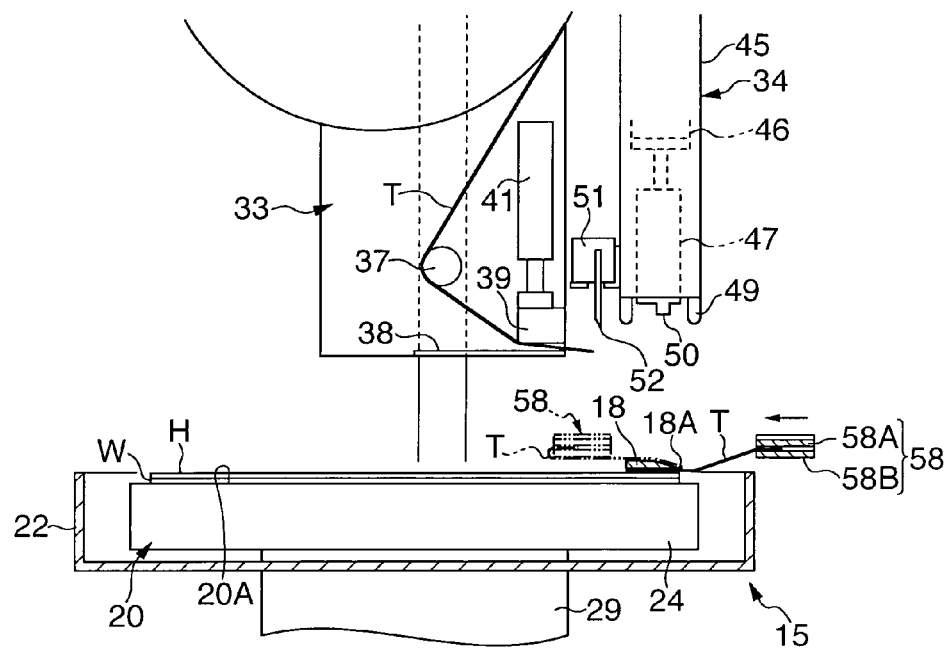
[FIG. 14]
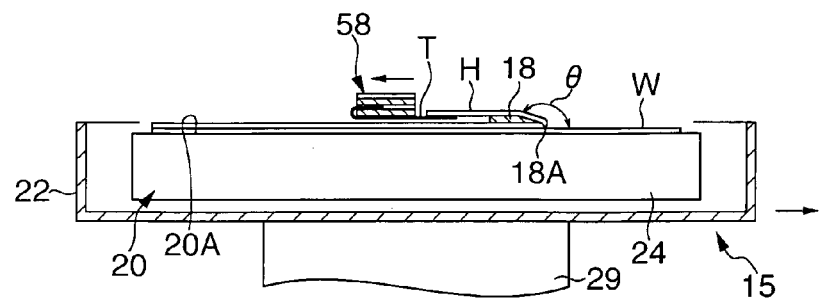

[FIG. 15]
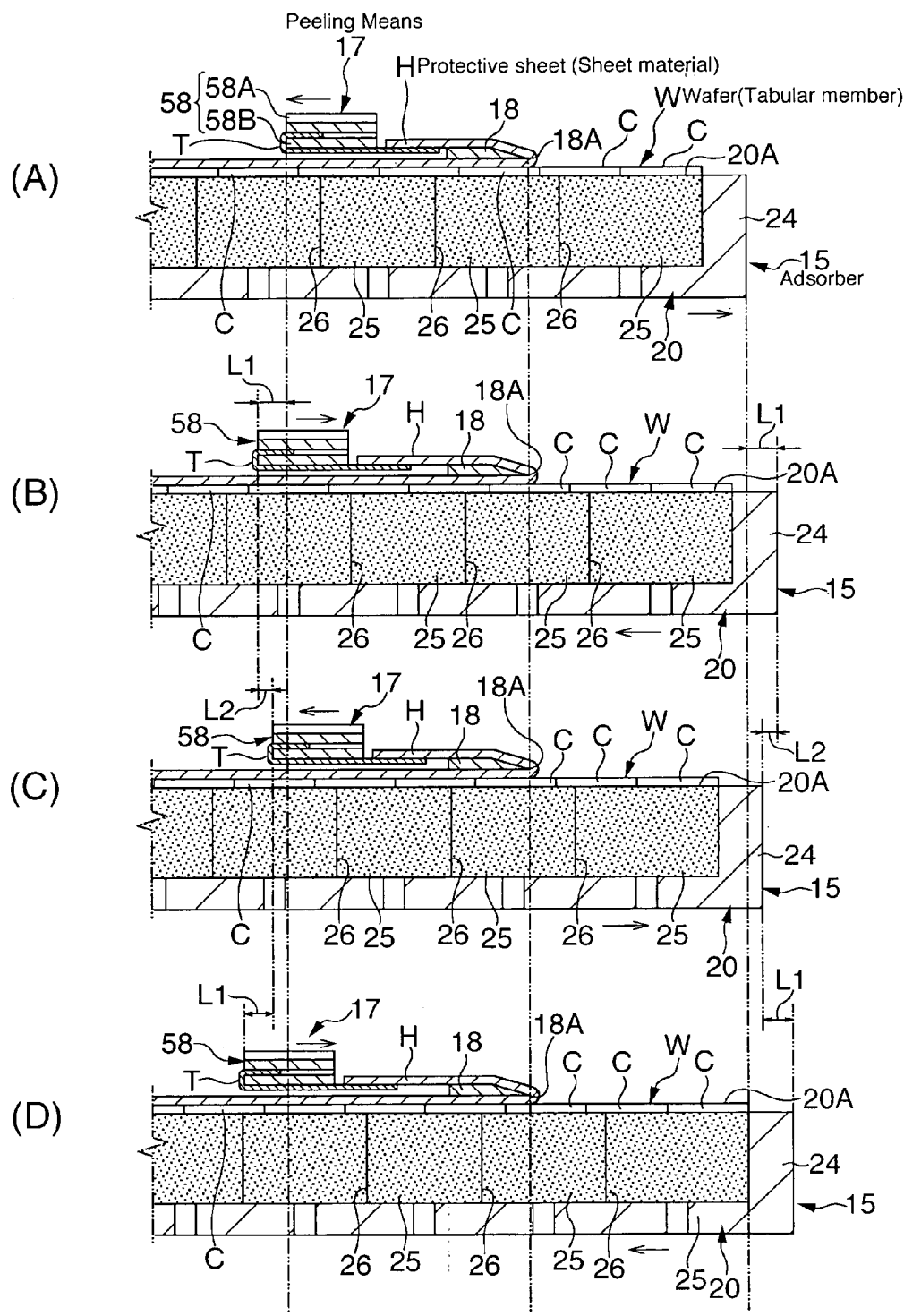

[FIG. 16]
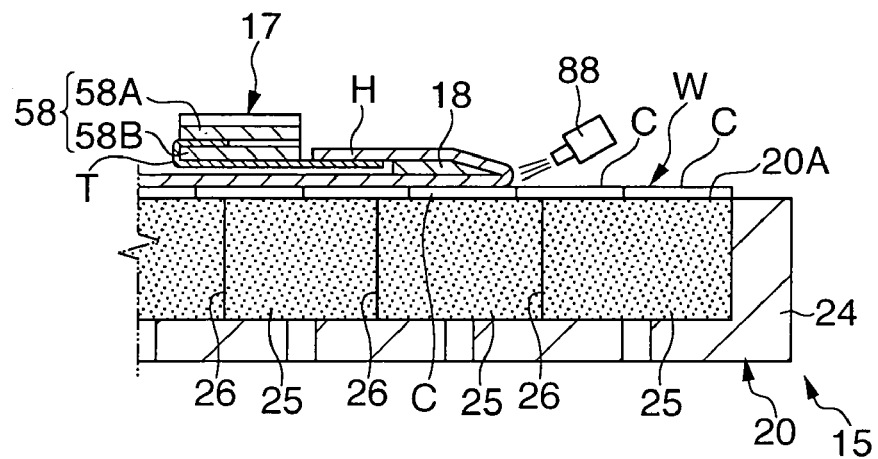
[FIG. 17]
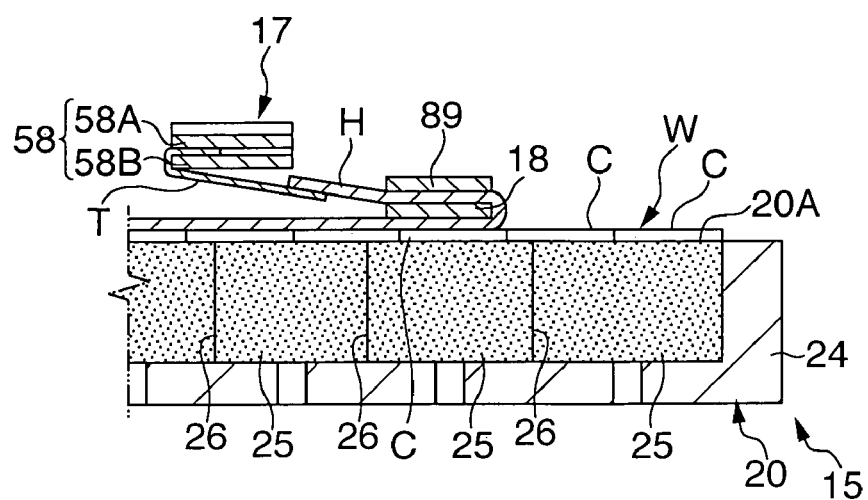

[FIG. 18]
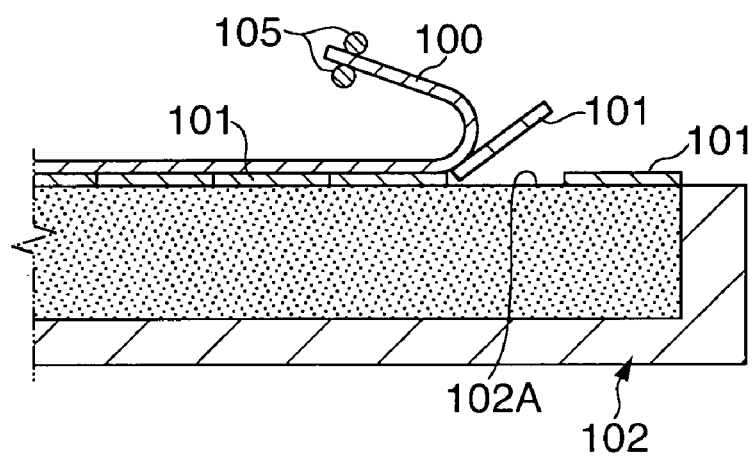

PEELING DEVICE AND PEELING METHOD

RELATED APPLICATIONS

The present application is based on, and claims priority from, Japanese Application Number 2004-015912, filed Jan. 23, 2004, the disclosure of which is hereby incorporated by reference herein in its entirety.

BACKGROUND OF THE INVENTION

1. Field of the Invention

The present invention relates to a peeling device and a peeling method, in particular to a peeling device and a peeling method for peeling off a sheet material, such as a protective sheet or the like, stuck on a tabular member such as a semiconductor wafer or the like.

2. Related Art

In a production process of semiconductors, such processes are adopted as: to stick a sheet material such as a protective sheet or the like in order to protect a pattern on a surface of a disc-shaped semiconductor wafer (hereunder referred to as "wafer"), namely a circuit surface, and grind the opposite surface of the circuit into a ultrathin thickness, thereafter perform dicing to the wafer in checkerboard pattern, and resultantly form a plurality of chips; or to apply half-dicing to the circuit face of a wafer beforehand in checkerboard pattern, thereafter stick a protective sheet or the like on the circuit surface, grind the opposite surface of the circuit into a ultrathin thickness, and resultantly form a plurality of chips.

The chips individualized in the state that the chips are fixed on the protective sheet or the like are picked up one by one after the protective sheet has been peeled off and each chip is bonded to a predetermined substrate (bonding) with a bonding apparatus.

As shown in FIG. 18, a peeling process has heretofore been arranged in such a way that, when a sheet material 100 is peeled off from each chip 101, in a state that each chip 101 is adsorbed and retained on the adsorbing face 102A of an adsorber 102, one end of a sheet material 100 is gripped by a peeling means 105 such as a chuck or the like, the peeling means 105 and the adsorbing face 102A are moved relatively to each other, whereby the sheet material 100 is peeled off from the chip 101 gradually from the end of the sheet material 100 toward the other end thereof (refer to Japanese laid-open Patent Publication No. 2000-315697).

However, in the event of peeling off such a sheet material 100 as mentioned above, when a chip 101 is thinned and downsized, the chip 101 is prone to bend at the time of the peeling-off and the adsorptivity of an adsorbing face 102A is likely to deteriorate due to air flow from a dicing line or the like, and as a result sometimes chips 101 happen to move upward from the adsorbing face 102A as shown in FIG. 18 and resultantly chips 101 crack or are damaged during the course of the peeling-off. Further, it sometimes happens that chips 101 move improperly on an adsorbing face 102A and adjacent chips 101 overlap with each other.

Such drawbacks cause that the yield ratio lowers due to cracked or damaged chips 101 and, when picking up chips 101 from topside by a bonding apparatus, lower chips 101 overlapped by others cannot be detected with a sensor or the like and the chip 101 cannot be picked up. Moreover, since a large gap between adjacent chips 101 is formed, through which air leakage is caused in the adsorber 102, such an inconvenience is led that the adsorptivity of an adsorbing face 102A further deteriorates and a sheet material 100 cannot be peeled off from the chips 101.

SUMMARY OF THE INVENTION

The present invention has been worked out in view of such drawbacks and the object of the present invention is to provide a peeling device and a peeling method which can prevent cracks and flaws of chips when a sheet material is peeled off from a tabular member such as a wafer comprising a plurality of chips or the like, and can peel off the sheet material from the tabular member securely.

In order to attain the object, the present invention is arranged so that a peeling device to peel off a sheet material stuck to a tabular member comprises: an adsorber having an adsorbing face that adsorbs and retains the tabular member; and a peeling means that retains the sheet material and is disposed so as to be movable relatively to the adsorber, wherein the adsorber and the peeling means are arranged so as to move relatively to each other a predetermined distance while peeling and counter-peeling operations are alternately performed, whereby the sheet material can be peeled off from the tabular member intermittently.

The present invention is also preferably arranged so that: the tabular member is composed of a semiconductor wafer comprising a plurality of chips individualized, by means of a sheet material; and the distance of relative move per one cycle of the peeling and counter-peeling operations is determined so as to be shorter than the length of a chip in the moving direction.

Further, the present invention can also be arranged so that: a fold-back member capable of folding back a peeled-off sheet material is disposed in the vicinity of the adsorber; and the adsorber and the peeling means move relatively to each other nearly symmetrically with reference to the fold-back member as the symmetric axis, thereby the peeling and counter-peeling operations are performed.

Furthermore, the present invention is preferably arranged so that the adsorber is provided with a heater for heating the adsorbing face.

In addition, a peeling off means of the present invention which peels off a sheet material stuck to a tabular member comprises an adsorber having an adsorbing face that adsorbs and retains the tabular member, and a peeling means that retains the sheet material and is disposed so as to be movable relatively to the adsorber, wherein the adsorber and the peeling means are arranged so as to move relatively to each other a predetermined distance while peeling and counter-peeling operations are alternately performed and the sheet material is peeled off from the tabular member intermittently.

According to the present invention, when a tabular member is a wafer that is composed of a plurality of chips, and even when a chip is moved upward from an adsorbing face accompanying with a peeling operation, a counter-peeling operation makes it possible to hold down the chip onto the adsorbing face again with a weak pressure through the sheet material.

Specifically, even when a sheet material is a low grade adhesive sheet or an ultraviolet-hardening pressure-sensitive adhesive sheet subjected to ultraviolet radiation, adhesiveness remains somewhat between a chip and the sheet material and the chip tends to move upward by the adhesiveness during a peeling operation. Nevertheless, a counter-peeling operation after the peeling operation makes it possible to hold down the chip onto an adsorbing face with a weak pressure and enhance the degree of vacuum at the adsorbing face.

That is, by repeating a peeling operation and a counter-peeling operation alternately, a sheet material is peeled off while maintaining each chip adsorbed on an adsorbing face stably. As a result, during the peeling-off of the sheet material, not only it is possible to prevent cracks and flaws on chips, but also it makes possible to avoid that chips move on the adsorbing face or chips are lost from the adsorbing face accompanying with the sheet material; resultantly it is possible to peel off the sheet material from each chip reliably, whereby conventional problems can be solved.

Here, even when a chip sticks again by a counter-peeling operation to a region of the sheet material where a sheet material has once been peeled off by a peeling operation, since the adhesiveness is caused by the weak pressure, the lift-up of the chip caused by the subsequent peeling operation can also be avoided.

Further, since the distance per one cycle of peeling and counter-peeling operations is determined as described above, plural cycles of peeling and counter-peeling operations can be applied to a piece of chip. Accordingly, weak pressure as mentioned above is imposed on a chip for several times and the lift-up of the chip from an adsorbing face can be prevented more reliably.

Furthermore, since a peeling operation and a counter-peeling operation are performed by moving an adsorber and a peeling means relatively to each other nearly symmetrically with reference to a fold-back member as the symmetric axis, it becomes possible to peel off a sheet material while performing smooth operations.

Yet further, if an adsorbing face is arranged to be heated by a heating means, then chips, a sheet material and adhesive between them can be heated, which facilitates the peeling-off of the sheet material.

BRIEF DESCRIPTION OF THE DRAWINGS

FIG. 1 is a perspective view showing the general arrangement of a bonding apparatus to which a peeling device according to the present embodiment is applied.

FIG. 2 is a plan view of a wafer,

FIG. 3 is a plan view of a lead frame,

FIG. 4 is a schematic perspective view of a peeling device,

FIG. 5 is a front view of FIG. 4,

FIG. 6 is a plan view of an adsorbing table,

FIG. 7 is a sectional view taken on line A—A of FIG. 6,

FIG. 8 is a plan view showing the periphery of an adsorbing table while peeling off of a protective sheet, FIG. 9 is an explanatory view showing the state that a peeling tape is paid out from the state shown in FIG. 5, FIG. 10 is an explanatory view showing a state right before a peeling tape is stuck to a protective sheet, FIG. 11 is an explanatory view showing immediately after a peeling tape stuck to a protective sheet is cut off, FIG. 12 is an explanatory view showing a state that a feeder and a heater/cutter unit are lifted from the state shown in FIG. 11, FIG. 13 is an explanatory view showing a state right before a protective sheet is peeled off, FIG. 14 an explanatory view showing a state that a protective sheet is being peeled off, FIGS. 15(A) to 15(D) are front sectional views of a substantial portion to explain a peeling operation and a counter-peeling operation, FIG. 16 is a front sectional view of a substantial portion of an example of a modified peeling device, FIG. 17 is a front sectional view of a substantial portion of an example of another modified peeling device, and FIG. 18 is a front sectional view of a substantial portion of an example of a conventional peeling device.

DETAILED DESCRIPTION OF THE PREFERRED EMBODIMENT

Embodiments according to the present invention are hereunder explained with reference to drawings.

Note that, in DESCRIPTION, X, Y and Z directions are represented by relevant arrows shown in FIG. 1.

FIG. 1 is a perspective view showing a general arrangement of a bonding apparatus to which a peeling device according to the present invention is applied. FIG. 2 is a plan view of a wafer W as a tabular member. In these drawings, the bonding apparatus 10 is an apparatus that picks up and bonds each of chips C formed on a nearly disc-shaped wafer W one by one to each of substrates K disposed in a ladder-shaped lead frame F shown also in FIG. 3.

A plurality of chips C are formed by dicing the wafer W in a checkerboard pattern. A protective sheet H as a sheet material is stuck on the side of the circuit face W1 of the wafer W with an ultraviolet-hardening pressure-sensitive adhesive interposed in between. The ultraviolet-hardening pressure-sensitive adhesive is prepared so as to be in a state that the adhesiveness thereof is reduced by applying ultraviolet radiation to the protective sheet H before it is set in the bonding apparatus 10. Further, a notch W2 is formed for alignment on the outer circumference of the wafer W. Meanwhile, a thermosensitive bond to bond a chip C is applied on the upper surface of each substrate K disposed in the lead frame F.

The bonding apparatus 10 comprises: a peeling device 11 to peel off the protective sheet H stuck to the wafer W; a transfer means 12 for transferring the wafer W to the peeling device 11; and a bonding means 14 for bonding the chip C to the substrate K through a pick-up means 13 of picking up the chip C one by one after the protective sheet H is peeled off.

The peeling apparatus 11 is, as shown in FIGS. 4 and 5, arranged to include: an adsorber 15 to adsorb and retain the reverse face of the circuit face W1 of the wafer W; a sticking device 16 to stick a peeling tape T composed of a heat-seal tape to the protective sheet H on the wafer W adsorbed and retained onto the adsorber 15; a peeling means 17 that retains the protective sheet H through the peeling tape T and is disposed so as to be movable relatively to the adsorber 15; and a fold-back member 18 that is disposed in the vicinity of the adsorber 15 and folds back the peeled-off protective sheet H (refer to FIG. 8). The peeling device 11 is arranged so as to peel off the protective sheet H from one end of the wafer W toward the other end thereof in the radial direction along Y direction of the wafer W, while folding back the protective sheet H by moving the adsorber 15 and the peeling means 17 relatively to each other, in other words, by moving them in Y direction in the manner of passing by each other with reference to an edge 18A, which will be described later, of the fold-back member 18 as the position of symmetric axis.

The adsorber 15 comprises: an adsorbing table 20 having an adsorbing face 20A on the upper surface thereof; a driving means 21 supporting the adsorbing table 20 from underside and moving the adsorbing table 20; and a receiving member 22 disposed on the outer circumference of the adsorbing table 20. The receiving member 22 is formed into the shape of a container having an opening at the upper part and is arranged so that chips C regarded as defective are dropped into the interior thereof and thereafter retrieved.

The adsorbing table 20 is, as shown in FIGS. 6 and 7, comprises: a table main body 24 formed into a shape of a container with a base plate and having a circular shape in a plan view; and a plurality of porous members 25 disposed inside the table main body 24.

The porous members 25 are arranged side by side in the direction in which the adsorbing table 20 moves at the time when the protective sheet H is peeled off, namely in Y direction (the transverse direction in FIG. 6) and a thin tabular partition member 26 is disposed at each boundary of adjacent porous members 25. A hose 27 is connected to the bottom of each porous member 25 respectively and air is sucked from the upper face of the relevant porous member 25 through the hose 27 with a certain decompression pump (not shown in the figures) and resultantly a chip C is adsorbed and retained onto the adsorbing face 20A. Here, each hose 27 is provided with an electromagnetic valve not shown in the figures and the suction air of each porous member 25 can be adjusted individually by opening and closing the electromagnetic valve. In this case, it is arranged so that each partition member 26 can prevent the air from flowing laterally between adjacent porous members 25.

The driving means 21 is, as shown in FIG. 4, comprises: a rotary shifter 29 that is disposed under the receiving member 22 and rotates the adsorbing table 20 in the circumferential direction; an X axis shifter 30 disposed under the rotary shifter 29; and a Y axis shifter 31 disposed under the X axis shifter 30. As the mechanism to drive those shifters 29 to 31, known units comprising various kinds of motors, cylinders, ball screws, linear guides and others are employed.

The sticking device 16 comprises: a feeder 33 to pay out a peeling tape T; and a heater/cutter unit 34 having functions of sticking the peeling tape T to an end of the protective sheet H by thermal fusion bonding and cutting off the peeling tape T at a portion on the left side of the thermal fusion bonding region as shown in FIG. 5.

The feeder 33 comprises: a holding roller 36 to hold a rolled peeling tape T and a guide roller 37; a tape receiving plate 38 disposed under the guide roller 37; and a tape hold down plate 39 disposed above the tape receiving plate 38. The tape hold down plate 39 is arranged so as to be vertically movable with a cylinder 41, and thus the peeling tape T is arranged to be held down with the tape hold down plate 39 on the tape receiving plate 38. In addition, the whole feeder 33 is arranged so as to be vertically movable with a cylinder 42.

The heater/cutter unit 34 comprises: a vertically long case body 45 disposed so as to be vertically movable by a cylinder 44; a heater block 47 driven vertically by a cylinder 46 in the case 45; and tape hold down guides 49, 49 disposed at the lower end of the case 45 in a manner of interposing the heater block 47 between both the left and right sides as shown in FIG. 5. A protrusion 50 that gives heat locally is disposed at the lower end of the heater block 47. Each of the lower ends of the tape hold down guides 49, 49 is formed so as to have a curved surface and arranged so as to hold down the peeling tape T from topside. Here, a cutter shift cylinder 51 is disposed on the left sidewall of the case 45 as shown in FIG. 5 and a cutter blade 52 is attached to the lower end thereof in the manner of protruding downward. The cutter blade 52 is arranged so as to be reciprocally movable in the direction perpendicular in the plane of FIG. 5 (X direction) by driving of the cutter shift cylinder 51. Further, an angle member 53 to guide movement of the cutter shift cylinder 51 is disposed on the left sidewall of the case 45 and a slot 53A through which the cutter blade 52 passes is formed in the angle member 53.

The peeling means 17 is disposed so as to be movable in Y direction via a feed shaft 55 extending in the direction nearly parallel with the direction of the aforementioned Y axis shifter 31. The peeling means 17 comprises: a slide truck 56 attached to the feed shaft 55; an arm 57 that is attached to the slide truck 56 and extends stepwise; and a chuck 58 attached to the tip of the arm 57. The chuck 58 is composed of an upper jaw 58A and a lower jaw 58B and it is arranged so as to open and close the chuck 58 by moving the upper jaw 58A vertically with a cylinder 59 and thus to hold the peeling tape T in between.

The fold-back member 18 is formed into a slender plate and supported in a turnable manner by a turnable support 61 at the base side. Specifically, the fold-back member 18 is arranged so as to be turnable between the standby position located outside the adsorber 15 (the position shown by the solid line in FIG. 4) and the fold-back position being located above the adsorbing face 20A and extending in X direction (the position shown by the two-dot chain line in FIG. 4). Further, the fold-back member 18 is provided with a sharp edge 18A at an end thereof in the direction of shorter side thereof (on the side abutting the protective sheet H) and it is arranged so that the angle of the protective sheet H folded back by the edge 18A (the angle θ in FIG. 14) is large.

The transfer means 12 is arranged so as to be able to transfer a wafer W contained in a state of piled up in a container 63 located on the left side in FIG. 1 onto the adsorbing table 20 transferred to the position shown by the two-dot chain line in the figure.

The transfer means 12 comprises: a lifter 64 to move the container 63 vertically; a first adsorbing pad 65 to adsorb the uppermost wafer W contained in the container 63; a second adsorbing pad 68 that is located above the first adsorbing pad 65 and moves along a slider 67 extending in X direction; and a camera 69 for alignment disposed in the middle of the longitudinal direction of the slider 67 and below the slider 67.

The lifter 64 moves the container 63 upward and, when the uppermost wafer W touches the adsorbing face 65A of the first adsorbing pad 65, a sensor not shown in the figure detects it and the movement of the container 63 stops. Thereafter, the first adsorbing pad 65 adsorbs the uppermost wafer W, the support axis 65B that supports the first adsorbing pad 65 rotates, thus the adsorbing face 65A is turned upward, and resultantly such a state that the wafer W is mounted on the upper side of the adsorbing face 65A is obtained. In this state, the second adsorbing pad 68 descends along with the support axis 68B that supports the second adsorbing pad 68, the adsorbing face 68A of the second adsorbing pad 68 adsorbs the wafer W, at the same time the adsorption of the wafer W by the first adsorbing pad 65 is released, and thus the transfer of the wafer W is carried out. The second adsorbing pad 68 that has adsorbed the wafer W moves in X direction along the slider 67 and the movement in X direction is stopped when it reaches the position where an alignment camera 69 can detect the wafer W. Here, the wafer W is aligned by detecting the notch W2 of the wafer W and an edge of a chip C with the alignment camera 69 while the wafer W is rotated in the circumferential direction by the support axis 68B of the second adsorbing pad 68. When the alignment is completed and the second adsorbing pad 68 further moves in X direction and reaches above the adsorbing table 20, the wafer W descends along with the support axis 68B, and the wafer W is set on the adsorbing face 20A of the adsorbing table 20 in the state that the position is aligned.

Though it is not restricted, a heater may be arranged at the adsorbing face 68A of the second adsorbing pad 68 to lower the adhesiveness between a wafer W and a protective sheet H by hardening a thermosetting adhesive of the protective sheet H during the course of transferring the wafer W.

The pick-up means 13 comprises: a first adsorbing head 73 disposed closer to the sticking device 16; a slider 85 capable of moving the first adsorbing head 73; and a first camera 76 disposed above the first adsorbing head 73.

The bonding means 14 is arranged in such a way that the lead frame F is transferred along two rail members 72, 72 extending between cassettes 71, 71 located on both sides thereof in X direction as shown in FIG. 1 and to be able to bond a chip C to each of the substrates K on the lead frame F; and provided with a second adsorbing head 74 disposed above the rail members 72, 72, a second camera 77 disposed above the second adsorbing head 74, and a third camera 78 attached to the second adsorbing head 74.

A plurality of lead frames F are contained in the cassette 71 vertically on the left side in FIG. 1 and a lead frames F is pushed out toward the side of the rail members 72, 72 with a stick arm 79 movable in X direction and transferred on the rail members 72, 72 with a chuck 81 moving along the rail members 72, 72. When a lead frame F reaches the middle of the length of the rail members 72, 72 (position shown by the two-dot chain line in FIG. 1), the transfer of the lead frame F with the chuck 81 stops and a heater 82 disposed under the two rail members 72, 72 is arranged to melt the heat sensitive adhesive applied on the upper surface of a substrate K.

Here, the heater 82 is disposed to be movable vertically with a cylinder not shown in the figure, and also arranged so that the heater is retained at a position apart from the bottom surface of a substrate K during the transfer of a lead frame F and moves upward to touch the bottom surface of the substrate K and heat the substrate K, when the transfer of the lead frame F stops.

The first adsorbing head 73 is arranged to transfer a chip C on the adsorbing face 20A of the adsorbing table 20 onto an intermediate stage 83 disposed in the vicinity of the heater 82 and the second adsorbing head 74 is arranged to be capable of transferring the chip C on the intermediate stage 83 onto each substrate K of a lead frame F and bonding it.

Here, the process of transferring a chip C is hereunder explained precisely. Firstly, a protective sheet H is peeled off from a wafer W by the peeling device 11, and thereafter the adsorbing table 20 is transferred in X and Y directions by the driving means 21 and in the circumferential direction of the wafer W with a rotary shifter 29 and placed nearly just below the first camera 76. Thereafter, the chip C is detected by the first camera 76 and the adsorbing table 20 moves by the driving means 21 so that the adsorbed chip C is placed nearly just below the first adsorbing head 73. Successively, the first adsorbing head 73 moves downward and adsorbs the chip C detected by the first camera 76 and thereafter the chip C adsorbed by the first adsorbing head 73 is placed on the intermediate stage 83 with the slider 85. The position and direction of the chip C placed on the intermediate stage 83 are detected by the second camera 77 and thereafter the second adsorbing head 74 is transferred with the slider 86 that supports the second adsorbing head 74 and the position of the substrate K is detected by the third camera 78. Then, on the basis of the detection results by the second and third cameras 77 and 78, the second adsorbing head 74 is transferred in X, Y and Z directions and in the circumferential direction of the chip C, the chip C on the intermediate stage 83 is transferred on the substrate K, whereby they can be bonded with a high degree of accuracy.

When chips C are bonded onto all of the substrates K (five pieces in the present embodiment) in a lead frame F, the lead frame F transfers along the rail members 72, 72 and is contained in the cassette 71 on the right side in FIG. 1. Then, the cassettes 71, 71 move vertically with the lifter 87, another lead frame F is pushed out from the cassette 71 on the left side in FIG. 1 to the rail members 72, 72, and also the lead frame F to which the chips C are bonded is contained in the cassette 71 on the right side in FIG. 1.

Next, the method for peeling off a protective sheet H from a wafer W by means of the adsorbing device 15 is explained.

Here, as shown in FIGS. 5 and 8, the wafer w is adsorbed and retained on the adsorbing face 20A of the adsorbing table 20 so that the protective sheet H faces the upper side and the wafer W is set with the transfer means 12 so that peripheral edges of chips C are inclined about 45 degrees with reference to the Y direction (the transverse direction in FIG. 8). Further, the adsorbing table 20 is placed under the sticking device 16 by the driving means 21.

In the state as shown in FIG. 9, the feeder 33 is lowered and advanced to the adsorbing table 20. Thereafter, the lead end of the peeling tape T passing through between the tape receiving plate 38 and the tape hold down plate 39 is held by the chuck 58 of the peeling means 17. Successively, the chuck 58 moves a predetermined distance in the direction of separating from the feeder 33 (in the right direction) with the feed shaft 55 and the peeling tape T is paid out by a predetermined length so that the lead end is placed under the heater/cutter unit 34.

In this way, in the state that the peeling tape T is paid out, as shown in FIG. 10, the case 45 of the heater/cutter unit 34 is lowered and the peeling tape T is held down from upper side with the tape hold down guides 49, 49 and, at the same time, the peeling tape T is pinched between the tape hold down plate 39 and the tape receiving plate 38 by driving the cylinder 41.

In the state, as shown in FIG. 11, the heater block 47 is lowered and the peeling tape T is stuck by thermal fusion to the protective sheet H by the protrusion 50. Then, the cutter blade 52 moves in the direction perpendicular to the plane of FIG. 11 and cuts off the peeling tape T. Thereafter, the feeder 33 and the heater/cutter unit 34 ascend (refer to FIG. 12).

Successively, as shown by the two-dot chain line in FIG. 4, the fold-back member 18 turns and is placed on one end side of the radial direction of the wafer W along the Y direction (on the right end side in FIG. 13). From this state, only the chuck 58 holding the peeling tape T is transferred to the position shown by the two-dot chain line in FIG. 13, namely to such a position where a predetermined tension is applied to the peeling tape T, and thereafter the adsorbing table 20 and the chuck 58 are moved relatively to each other, namely the adsorbing table 20 is moved in the right direction in FIG. 13 and the chuck 58 is moved in the left direction in the figure. Consequently the protective sheet H is peeled off from one end toward the other end in the radial direction while the protective sheet H is folded back at an obtuse angle θ with the fold-back member 18 (refer to FIG. 14).

Here, the peeling-off of a protective sheet H is further explained in detail referring to FIG. 15(A) to 15(D).

FIG. 15(A) shows an arbitrary intermediate state during the process of peeling off a protective sheet H. From the position shown in FIG. 15(A) to the position shown in FIG.

15(B), the adsorbing table 20 of the adsorber 15 and the chuck 58 of the peeling means 17 move relatively to each other nearly symmetrically for a nearly identical distance (the reference character L1 in FIG. 15(B)) at a nearly identical speed in Y direction in the manner of separating from each other with reference to the edge 18A of the fold-back member 18 as a symmetric axis. Hence the peeled area of the protective sheet H increases and the movement of the adsorbing table 20 and the chuck 58 in this mode is defined as a peeling operation.

Next, from the position shown in FIG. 15(B) to the position shown in FIG. 15(C), the adsorbing table 20 and the chuck 58 move in the direction opposite to that in the peeling operation. The movement is defined as a counter-peeling operation and the distance L2 which the adsorbing table 20 and the chuck 58 travel in a counter-peeling operation is set at a nearly identical value and the transfer speed thereof is also set at a nearly identical value. By the counter-peeling operation, the chip C at the fold-back position of the protective sheet H is pushed back again to the adsorbing face 20 with a weak pressure via the protective sheet H and resultantly the adhesiveness between the chip C and the adsorbing face 20A is enhanced. Here, the distance L2 is set to be smaller than the distance L1 and the distance L1 is set to be smaller than the length of a chip C in Y direction (the transverse direction in the figure).

After the counter-peeling operation is completed, in the same way as described earlier, the adsorbing table 20 and the chuck 58 get into the peeling operation of the travel distance L1 (refer to FIG. 15(D)) and, after the completion of the peeling operation, the counter-peeling operation starts again.

In this way, the protective sheet H is peeled off intermittently from the wafer W by moving the adsorbing table 20 and the chuck 58 relatively to each other while repeating the peeling operation and the counter-peeling operation alternately. While doing so, the chip C is pushed down again with a weak pressure via the protective sheet H peeled off once, the degree of vacuum, which has been lowering, of the adsorbing table 20 recovers, thereafter a peeling operation is applied again, and therefore the lift-up of the chip C from the adsorbing face 20A is avoided.

Here, by appropriately opening and closing the electromagnetic valve of the hose 27 connected to a porous member 25, it is possible to increase the suction force of the porous member 25 at the fold-back position of the protective sheet H to a degree higher than other porous members 25 and to prevent the lift-up of the chip C at the fold-back position of the protective sheet H more securely.

Consequently, according to the present embodiment, since a protective sheet H is peeled off from a wafer. W through repeating a peeling operation and a counter-peeling operation alternately, even if a chip C lifts up from the adsorbing face 20A together with a protective sheet H during a peeling operation, it is possible to adsorb the lifted-up chip C back to the original position of the adsorbing face 20A by a counter-peeling operation. In this way, the area of the peeled portion of the protective sheet H increases step by step and resultantly it becomes possible to avoid the displacement of the chip C on the adsorbing face 20A and others.

The best configuration, method and the like for carrying put the present invention are disclosed in the above descriptions but the present invention is not limited to those.

That is, the present invention is specifically shown in the figures and explained mainly on the basis of a specific embodiment. However, the present invention allows the aforementioned embodiment to be widely modified by those skilled in the art in detailed configurations including shapes, materials, the number of pieces and others without deviating from the scope of the technological thought and the object of the present invention.

Accordingly, the shapes, materials and others disclosed above are described in a limited way as examples in order to facilitate the comprehension of the present invention and the present invention is not limited by those. Therefore, descriptions using such denominations of members as deviated from some or all of the limitations in shapes, materials and others are included in the present invention.

For example, as shown in FIG. 16, a nozzle 88 that ejects air or ions for electrostatic dissipation may be disposed at the fold-back position of a protective sheet H. In this case, the protective sheet H can be peeled off from a wafer W more smoothly.

Further, a heating means such as a heater may be arranged at the adsorbing table 20 to heat the adsorbing face 20A by the heating means, and furthermore a wafer W adsorbed on the adsorbing face 20A, a protective sheet H, and an adhesive between them, as well. By such an arrangement, not only a protective sheet H can be peeled off easily but also each chip C is heated and therefore the reliability of the bonding between the chip C and a substrate K by the bonding means 14 is enhanced. Further, by arranging the intermediate stage 83 to be heated by a heater or the like, a chip C is heated until just before it is bonded to a substrate K and therefore the chip C can be bonded to the substrate K more securely.

Furthermore, as shown in FIG. 17, a hold down plate 89 may be provided in such a constitution that to hold down a protective sheet H folded back with the fold-back member 18 onto the upper surface of the fold-back member 18. By such an arrangement, the fold-back angle θ of the protective sheet H can stably be maintained and therefore the lift-up of a chip C can be avoided more effectively.

Yet further, though a sheet material is used as the protective sheet H in the aforementioned embodiment, this is not the only case but it is also acceptable for example to use a dicing sheet or a die-attach film by which an adhesive remains on the side of a wafer W after peeling-off. Here, in the case where a dicing sheet is used as the sheet material, it becomes possible to separate the dicing sheet from a ring frame to hold the dicing sheet with a predetermined cutting mechanism and to hold the end of the dicing sheet protruding from the outer circumference of a wafer W with the peeling means 17 without the use of a peeling tape T.

The present invention can be used as a device to peel off a tape protecting a circuit face particularly in the production process of semiconductor wafers.

What is claimed is:

1. A method for peeling a sheet material from a substrate, said method comprising:
   retaining said substrate by a holder;
   holding a portion of said sheet material by a peeler; and
   repeatedly moving said peeler, which holds the portion of said sheet material, relatively to said holder, which retains said substrate, and alternately in first and second opposite directions until said sheet material is completely peeled off said substrate.

2. The method according to claim 1, wherein
   said substrate comprises a semiconductor wafer comprising a plurality of singulated chips; and
   said moving step comprising repeatedly and alternately moving said peeler relative to said holder a first distance in the first direction and then a second distance in the second, opposite direction, wherein said first and second distances are shorter than the length of each of the singulated chips as measured in said first direction.

3. The method according to claim 2, wherein the second distance is shorter than the first distance to effect intermittent peeling of said sheet material in said first direction.

4. The method according to claim 1, further comprising positioning a folding guide member in the vicinity of said holder; and during said moving, folding a peeled portion of the sheet material over said folding guide member so that said folding guide member is disposed between the peeled portion and a unpeeled portion of said sheet material;

wherein in said moving step, both said peeler and holder are moved relative to said folding guide member.

5. The method according to claim 4, wherein a relative movement between said peeler and said holder in either of said opposite directions is performed in said moving step by moving said holder and peeler relative to said folding guide member substantially equal distances in said opposite directions, respectively.

6. The method according to claim 1, wherein, in said retaining, the substrate is retained on a holding surface of said holder which is a suction holder;

said method further comprising heating said holding surface.

7. The method according to claim 1, wherein said moving step comprises repeatedly and alternately moving said peeler relative to said holder a first distance in the first direction and then a second distance in the second, opposite direction, wherein said second distance is shorter than the first distance which, in turn, is shorter than a dimension of said substrate as measured in said first direction.

8. The method according to claim 7, wherein said substrate comprises a semiconductor wafer comprising a plurality of singulated chips; and said first and second distances are shorter than the length of each of the singulated chips as measured in said first direction.

9. The method according to claim 1, wherein said retaining comprises holding the substrate by suction on a holding surface of said holder;

said method further comprising, during said moving when said sheet material has a fold caused by a peeled portion of the sheet material being folded back over a unpeeled portion of said sheet material, increasing a suction force of said holder in the vicinity of said fold to prevent a portion of said substrate adjacent said fold from being lifted with the peeled portion of the sheet material.

10. The method according to claim 1, further comprising, during said moving when said sheet material has a fold caused by a peeled portion of the sheet material being folded back over a unpeeled portion of said sheet material, blowing air or ions at said fold.

11. A peeling device for peeling a sheet material from a substrate, said device comprising:

holding means for retaining said substrate;

peeling means for holding a portion of said sheet material, said peeling means being movable relatively to said holding means;

moving means for repeatedly moving said peeling means relatively to said holding means alternately in first and second opposite directions and intermittently peeling the sheet material off said substrate;

an adhesive tape supply; and a heater/cutter for adhering a length of adhesive tape unwound from said supply to said portion of said sheet material by thermal fusion bonding and cutting said length of adhesive tape.

12. The device according to claim 11, said peeling means comprising a moveable chuck including two jaws moveable relative to each other for gripping the cut length of adhesive tape.

* * * * *